United States Patent [19]
Knutson

[11] Patent Number: 6,014,082
[45] Date of Patent: Jan. 11, 2000

[54] TEMPERATURE MONITORING AND CALIBRATION SYSTEM FOR CONTROL OF A HEATED CVD CHUCK

[75] Inventor: Paul L. Knutson, San Antonio, Tex.

[73] Assignees: Sony Corporation, Tokyo, Japan; Sony Electronics Inc., Park Ridge, N.J.

[21] Appl. No.: 08/943,988

[22] Filed: Oct. 3, 1997

[51] Int. Cl.[7] .................................................. G08B 17/00
[52] U.S. Cl. ...................... 340/584; 340/596; 340/680; 216/60; 165/61; 219/385; 219/506; 29/25.01; 118/666; 118/725; 204/298.03
[58] Field of Search ................................... 340/584, 588, 340/589, 596, 597, 680; 216/60; 165/80.3, 61, 80.1; 219/506, 411, 385; 427/8; 29/25.01; 204/298.09, 192.17, 298.03; 118/666, 723 E, 725

[56] References Cited

U.S. PATENT DOCUMENTS

| | | | |
|---|---|---|---|
| 3,369,989 | 2/1968 | Kay et al. | 204/298.09 |
| 4,396,640 | 8/1983 | Rocheleau et al. | 427/8 |
| 4,470,369 | 9/1984 | Edgerton | 118/723 R |
| 4,535,227 | 8/1985 | Shimizu | 219/411 |
| 4,604,518 | 8/1986 | Payne | 219/506 |
| 4,647,361 | 3/1987 | Bauer | 204/298.09 |
| 4,680,061 | 7/1987 | Lamont, Jr. | 250/398 |
| 4,680,451 | 7/1987 | Gat et al. | 219/411 |
| 4,771,730 | 9/1988 | Tezuka | 118/723 E |
| 4,777,022 | 10/1988 | Boldish et al. | 118/666 |
| 4,810,342 | 3/1989 | Inoue | 204/192.17 |
| 4,821,674 | 4/1989 | deBoer et al. | 118/666 |
| 4,909,314 | 3/1990 | Lamont, Jr. | 165/80.3 |
| 4,933,063 | 6/1990 | Katsura et al. | 204/298.03 |
| 4,971,653 | 11/1990 | Powell et al. | 438/5 |
| 4,987,856 | 1/1991 | Hey et al. | 118/723 E |
| 4,996,942 | 3/1991 | deBoer et al. | 118/666 |
| 5,063,031 | 11/1991 | Sato | 29/25.01 |
| 5,113,929 | 5/1992 | Nakagawa et al. | 165/61 |
| 5,133,286 | 7/1992 | Choo et al. | 118/725 |
| 5,147,498 | 9/1992 | Nashimoto | 216/60 |
| 5,267,607 | 12/1993 | Wada | 165/80.1 |
| 5,273,588 | 12/1993 | Foster et al. | 118/723 E |
| 5,294,778 | 3/1994 | Carman et al. | 219/385 |
| 5,370,739 | 12/1994 | Foster et al. | 118/725 |
| 5,614,247 | 3/1997 | Barbee et al. | 427/8 |
| 5,747,778 | 5/1998 | Liu | 219/506 |

FOREIGN PATENT DOCUMENTS

0452779 A2  10/1991  European Pat. Off. .

*Primary Examiner*—Benjamin C. Lee
*Attorney, Agent, or Firm*—Wood, Herron & Evans, LLP

[57] ABSTRACT

A system coupleable to a heated wafer chuck control system provides an indication that the heated wafer chuck is operating at a temperature outside of a desired operational temperature range for the chuck. The system comprises: an operational temperature circuit for generating an operational temperature limit signal. The operational temperature limit signal is reflective of a selected operational temperature limit for a heated wafer chuck. An input circuit configured for coupling to a heated wafer chuck control system provides a chuck temperature signal which is reflective of the actual measured temperature of the heated chuck. A comparator circuit coupled to the operational temperature circuit and the input circuit compares the operational temperature limit signal to the chuck temperature signal and provides an output signal. Depending upon the output signal, an indicator generates a humanly-perceptible indication of the chuck temperature status in response to said output signal, and an interface circuit controls other aspects of the system for turning the chuck OFF. The system includes circuitry for verifying and calibrating the operation of the control board for the heated chuck.

26 Claims, 3 Drawing Sheets

TEMPERATURE MONITORING AND CALIBRATION SYSTEM FOR CONTROL OF A HEATED CVD CHUCK

FIELD OF THE INVENTION

This invention relates generally to the control and calibration of a heated chuck utilized in CVD processes, and more specifically to the monitoring and calibration of a temperature control system coupled to the chuck for proper control of the chuck and the prevention of chuck overheating and temperature runaway.

BACKGROUND OF THE INVENTION

Chemical vapor deposition or CVD processes are widely utilized in semiconductor fabrication. Generally, in a CVD process, several constituent gases are mixed together in a reaction chamber containing a heated substrate, such as a semiconductor wafer. A chemical reaction occurs between the constituent gases close to or at an exposed, elevated temperature surface of the wafer in the chamber and produces a material film or layer on the wafer surface. The deposition of the layer on the wafer and the type of layer which is formed depends upon the constituent gases chosen and the chemical reaction between those gases, and may, for example, be titanium, titanium nitride, tungsten, tungsten silicide, etc.

The wafer receiving a material layer by CVD is supported in the reaction chamber by a suitable mount. The wafer mount conventionally has a planar support platform which supports the wafer from below to expose an upper surface of the wafer. The gas constituents of the CVD process require energy at the exposed upper surface of the wafer for proper chemical reaction and layer formation. Therefore, energy is often provided to the CVD process in the reaction chamber, and specifically, proximate the wafer to assist the chemical reaction. In one conventional CVD process, such energy is provided in the form of heat or thermal energy, which is applied to the reaction chamber itself or directly to the wafer being processed.

When applying heat to a wafer for one particular CVD process, the mount supporting the wafer within the CVD reaction chamber is a heated wafer chuck. The wafer to be processed contacts and is supported by the heated chuck, and heat or thermal energy is therefore applied directly to the wafer by conduction from the heated chuck. The walls of the CVD chamber in such a process are not heated, due to the direct heating of the wafer. Therefore, such a CVD process is commonly referred to as a "cold wall" CVD process.

One particular use for a cold wall, heated chuck CVD process is to apply tungsten silicide or a blanket film of tungsten onto a silicon wafer. For such depositions, silane, argon, and a tungsten-containing gas, such as $WF_6$, are premixed and are then introduced into the reaction chamber. The thermal energy supplied to the wafer drives and sustains the necessary chemical reaction for forming the desired film. As mentioned, the heated chuck provides heat energy to accomplish the CVD process through the transfer of heat to the wafer.

The amount of thermal energy required for CVD processes makes it necessary to heat the chucks to very high temperatures, e.g., from 360° C. up to 600° C. Therefore, such CVD systems include chuck temperature control systems and components which operate the heated chuck. During the CVD process, the temperature of the chuck is precisely controlled. More specifically, a resistive thermal device (RTD) probe is thermally coupled to the chuck to monitor the temperature of the chuck as it is heated during a CVD coating process. RTD probes are elements which have an effective output electrical resistance which is directly proportional to the temperature of the probe. Such RTD probes are usually physically embedded inside of the body of the heated chuck whose temperature is to be monitored. RTD probes provide an indication, in the form of a measurable electrical resistance, of the temperature of the heated chuck. The chuck temperature control system then heats or cools the chuck, depending upon the RTD probe reading, to maintain it at a selected operational temperature.

One available CVD system utilizing thermal chucks and RTD probes is the Genus 8700 LPCVD system manufactured by GENUS of Sunnyvale, Calif. The GENUS system has six thermal or heated chucks made of Monel, a copper/nickel alloy, and each chuck utilizes a separate RTD probe. Each heated chuck is controlled by a separate temperature control system for applying heat to the chuck and monitoring the RTD probe. The individual RTD probes are embedded inside beryllium caps for insulation and protection inside of the heated chucks.

The high temperatures of the heated chuck and associated processing components make it imperative that the chuck temperature control system and RTD probes operate properly. A malfunctioning RTD probe or control system may cause overheating and thermal runaway of the heated chuck. The overheated chucks, in turn, may cause a meltdown of one or more of the chucks within the CVD system. Not only may such a meltdown cause failure of the entire CVD system and damage to the wafers being processed, but it may create safety concerns as well, due to the high temperatures involved.

In addition to thermal runaway, the calibration and verification of the operating status of the temperature control systems and RTD probes is also a concern. While malfunctioning RTD probes and control systems may not lead to overheating and meltdown, their operation may be sufficiently degraded such that the overall CVD process is hindered, or even prevented. Accordingly, it is necessary to calibrate and verify the operation of the control systems, and particularly to calibrate their associated RTD probes.

Conventionally, calibration and verification of a heated chuck temperature control system and RTD probe takes a substantial amount of time. A "black box" verification circuit must be specially built for a particular chuck temperature control system. The "black box" circuit must then be calibrated and interfaced to the chuck temperature control system each time the calibration of the system is performed. To do so, the RTD probe must be unplugged, which would shut the system off. However, it is desirable that the system be running when it is calibrated and verified.

Furthermore, currently available temperature monitoring systems for multiple heated CVD chucks are usually incorporated onto a single circuit board, making the multiple control systems difficult to isolate and analyze. Failure of the control system for a single heated chuck which is not corrected may then affect the entire system and the operation and monitoring of the other heated chucks. Therefore, it is desirable to immediately repair or calibrate each heated chuck control system which is malfunctioning.

Still further, the physical difficulty of accessing and isolating the various temperature control systems for verifying the operation of each, as well as calibrating each, makes the process slow, tedious, and therefore, expensive from a maintenance and production standpoint.

Accordingly, it is an objective of the present invention to create a more thermally stable CVD process, utilizing available CVD systems.

To that end, it is another objective of the present invention to prevent overheating and thermal runaway of heated CVD chucks and the malfunctions and problems caused thereby.

It is still another objective of the present invention to eliminate the difficulty of calibrating and verifying the operation of CVD chuck temperature control systems and the RTD probes associated therewith and thus reduce maintenance and production costs.

It is still another objective of the invention to isolate the temperature calibration and monitoring steps for each individual heated chuck of a multi-chuck CVD system to eliminate time wasted on checking all the chucks each time the system is used.

It is another objective to provide monitoring and control of an overheated chuck within a multiple chuck CVD system to prevent thermal runaway of the chuck without significantly affecting the overall CVD system.

These objectives and other objectives will become more readily apparent from the further description of the invention below.

SUMMARY OF THE INVENTION

The present invention achieves the above-discussed objectives and other objectives by providing a temperature monitoring and calibration system for controlling a heated CVD chuck which provides a visual indication that the heated wafer chuck is operating at a temperature exceeding the desired operational temperature. The system is also capable of controlling the operation of the heated chuck to prevent thermal runaway and meltdown. The inventive system preferably provides a visual indication that the heated chuck is operating within a desired temperature range or is above or below an operational temperature limit. The output of the system, depending upon the operational state of the heated chuck, is then utilized to turn off one or more of the chucks within a multiple chuck CVD system. Furthermore, the system may be utilized to readily calibrate the control board of a resistive temperature probe, and to verify the operation of the probe when the heated chuck is in a cold, non-operational state, and when the heated chuck is in a heated, operational state.

More specifically, the inventive system is coupleable to a heated wafer chuck control system, and specifically to the control board of an RTD probe, for providing an indication that the heated wafer chuck is operating at a temperature above or below the desired operational temperature for the chuck. RTD probes are well known devices, and are available from various sources, including Weed Instruments, Round Rock, Tex., under Model No. 11677-00. The system comprises an operational temperature circuit which generates an operational temperature limit signal to be used as a reference signal. The operational temperature limit signal is preferably a voltage signal which is reflective of a selected operational temperature limit for a heated wafer chuck. The limit may be either a high temperature limit or a low temperature limit. The temperature limit signal is scaled in Volts according to an appropriate temperature/voltage scale. The system further comprises an input circuit for coupling to a heated wafer chuck control system, and specifically to the RTD probe control board. The input circuit receives a chuck temperature signal from the RTD board, which is a voltage signal reflective of the actual measured temperature of the heated chuck, as measured by the RTD probe. Accordingly, the chuck temperature signal is also scaled to be a voltage value reflective of a selected temperature/voltage scale.

A comparator circuit of the system is coupled to the operational temperature circuit and the input circuit. The comparator circuit is operable for comparing the operational temperature limit signal to the measured chuck temperature signal, and providing an output signal reflective of such a comparison. An indicator and an interface circuit are coupled to the comparator circuit and are responsive to the output signal. More specifically, the indicator includes a plurality of lights, such as LEDs, which are selectively illuminated depending upon the operational state of the heated chuck. If the heated chuck is operating below the selected operational temperature limit, then a green LED is lit to indicate that the heated chuck is operating properly. If the heated chuck temperature exceeds the operational temperature limit, then a red LED is illuminated for indicating that the heated chuck should be turned off and cooled to prevent a meltdown or other thermal runaway problems. An interface circuit, preferably including at least one switch, is coupled to the comparator, and may be utilized for turning ON or OFF one or more chucks in a multiple-chuck CVD system, depending upon their operation, and the operation of the LEDs.

In a preferred embodiment, the operational temperature circuit comprises an adjustable voltage source coupled to a variable resistor for selecting the operational temperature limit voltage. The comparator circuit comprises an operational amplifier conventionally configured as a comparator which receives the operational temperature limit signal at its negative input terminal, and the chuck temperature signal at the positive terminal input. In one embodiment, when the chuck temperature signal, which is reflective of the measured temperature of the chuck, exceeds the operational temperature limit signal, the operational amplifier output selectively illuminates the LEDs of the indicator and opens and closes switches of the interface circuit. In another embodiment, the indicators and interface circuit are operated accordingly to indicate that the chuck temperature is below a lower limit.

In accordance with another aspect of the present invention, a system for calibrating the control board of an RTD probe comprises a first resistance network which has an electrical resistance simulating the resistance of the RTD probe, in a non-operational state, and a second resistance network which has an electrical resistance simulating the resistance of the probe in an operational state. A switch having multiple, mutually exclusive positions is coupleable between the RTD probe and its associated control board. In the first position of the switch, the probe and control board are electrically connected for normal operation of the heated chuck. In a second position of the switch, the probe is disconnected from the control board and the first resistance network is connected thereto to simulate the temperature probe in the non-operational state. Similarly, in the third position of the switch, the probe is again disconnected and the second resistance network is connected to the control board for simulating the temperature probe in the operational state. In that way, the probe may be selectively connected and disconnected from the control board for purposes of verifying the operation of the probe, and calibrating the probe control board without the probe, and without operating the entire CVD system.

In the preferred embodiment of the invention, the first and second resistance networks include variable resistors which may be adjusted to simulate a resistance value that is reflective of a particular temperature of the RTD probe in either the operational state, i.e., during a CVD process, or in a non-operational state, i.e., at room temperature. Therefore, the probe control board may be easily calibrated for a wide variety of temperature ranges.

In accordance with another aspect of the present invention, test junctions are coupled to the operational temperature circuit, the input circuit, the comparator, and to the first and second resistance networks for readily analyzing the various subsystems of the invention, and also for setting operational values for such subsystems.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
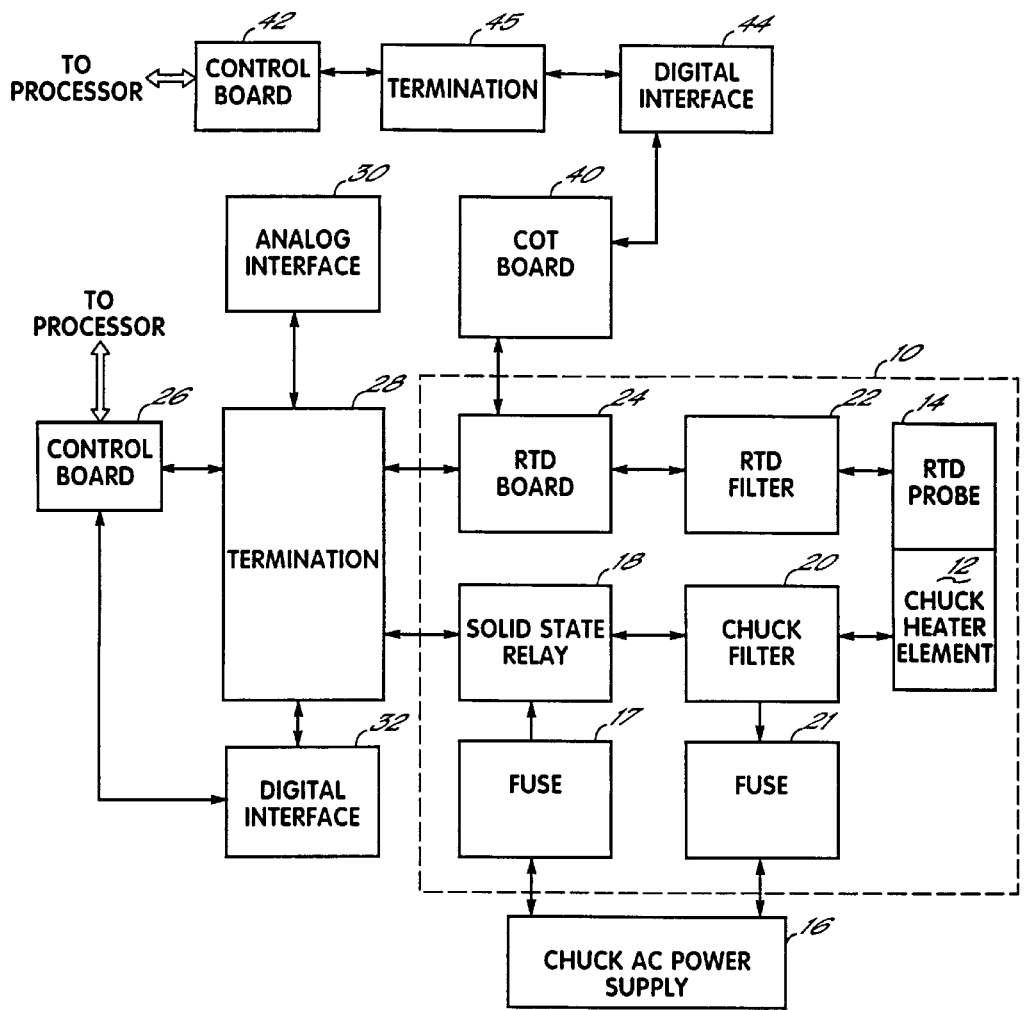
FIG. 1 is a block diagram of the present invention incorporated in an existing commercial CVD system.

FIG. 1 is a block diagram of the present invention incorporated in the temperature control system for a heated chuck utilized in the commercially available GENUS 8700 LPCVD System. The block diagram of FIG. 1 is helpful in illustrating how the inventive system, which includes a chuck over-temperature board or COT board, interfaces with the GENUS system. Further details regarding the GENUS system are available in the Customer Drawing Book 358-200, Revision A, available from GENUS, Inc. of Sunnyvale, Calif., which Customer Drawing Book is incorporated herein by reference in its entirety.

The temperature control circuitry 10 controls the delivery of heat or thermal energy to a heated CVD chuck (not shown) through the chuck heater element 12 and the RTD probe 14, which is in thermal communication with the heated chuck. Generally, the chuck heater element 12 is mounted to and thermally coupled to the CVD chuck of the CVD system and the RTD probe of the GENUS CVD system is surrounded by a beryllium cap and is embedded within the heated CVD chuck for measuring the temperature of the chuck and providing a resistive output signal for processing. Power is selectively and cyclically applied to the chuck heater element 12 for heating the chuck in cycles, depending upon the output of the RTD probe and the control system 10 of the GENUS CVD System. It will be understood by a person of ordinary skill in the art that CVD systems other than the GENUS 8700 System might be utilized with the present invention.

The chuck is preferably a metal, such as Monel™, an alloy of nickel, copper, iron and manganese, and has a chuck heater element 12 physically connected thereto. One conventional type of heater element is a heater coil which is physically embedded inside of the chuck. An appropriate chuck AC power supply 16 is coupled through a fuse 17 to a solid state relay 18. The solid state relay 18 opens and closes depending upon the operation of system 10 and the overall CVD system, and selectively delivers power from supply 16 to the chuck heater element 12 through a filter 20, which is also coupled through a fuse 21 to the chuck AC power supply 16. Relay 18 is opened and closed by the GENUS system in response to temperature readings from the RTD probe 14 for properly supplying power to element 12 and heating the chuck as required by the CVD process and a CVD system algorithm.

Chuck filter 20 filters stray RF signals and noise which might otherwise be delivered from the chuck heater element 12 through relay 18, and back into the CVD system. For example, RF might be utilized in a plasma enhanced CVD process or during an RF cleaning process.

The RTD probe 14 is coupled through a similar filter 22 to the RTD probe control board 24. The filter 22 prevents RF signals from reaching the RTD board 24 during RF plasma enhanced CVD or the cleaning of the inside of the CVD processing chamber. For example, if the beryllium caps surrounding the RTD probe break, probe 14 may be exposed to RF power. Accordingly, filter 22 prevents such an RF signal from interfering with or damaging the RTD board 24.

Both the RTD board 24 and solid state relay 18 are coupled to an appropriate control board 26 through appropriate termination circuitry 28. The RTD board 24 interfaces with board 26 through analog interface circuitry 30 also coupled to termination circuitry 28. The analog interface circuitry 30 provides the necessary isolation and amplification of control signals from RTD board 24 for interfacing with board 26. Board 26, in turn, interfaces directly with the processor (not shown) of the CVD system, such as the GENUS 8700 System. The system is a specially programmed microcomputer which controls all aspects and functions of the CVD system, as is well known in the art. The processor controls the heating of the chuck according to an internal algorithm for the system. Board 26 interfaces with solid state relay 18 through digital interface circuitry 32 coupled through the termination circuitry 28. The system processor, through board 26 and the digital interface circuitry 32, opens and closes the solid state relay 18 to selectively deliver power to the chuck heater element 12, as necessary for the CVD process. Therefore, the chuck is heated selectively to attain the desired operational temperature of the chuck for the CVD process. The system processor constantly reads the output signal of the RTD probe 14 through RTD board 24 and operates (i.e., opens and closes) relay 18 as appropriate for properly heating the chuck of the CVD system, The chuck over-temperature board, or COT board 40 of the invention interfaces with the RTD board 24 as discussed further hereinbelow. COT board 40 provides an input to the system processor through another control board 42. The COT board 40, as discussed further below, interfaces with board 42 through appropriate digital interface circuitry 44 and appropriate termination circuitry 45, as is readily understood by a person of ordinary skill in the art.

The CVD processing system, such as the GENUS 8700 System, generally will include a plurality of heated chucks for processing multiple substrates. For example, the GENUS 8700 System includes six heated chucks. Accordingly, the circuitry illustrated in FIG. 1, including the COT board 40, will be duplicated for each heated chuck, to provide for proper control and operation thereof in accordance with the principles of the present invention. The invention thus allows isolation of each heated chuck system and ready access to the probe and probe control systems for calibration, verification, and monitoring, as discussed below.

The control system provided by the COT board 40 of the invention includes a number of subsystems and features which will be discussed individually hereinbelow for clarity.

Figure 5:
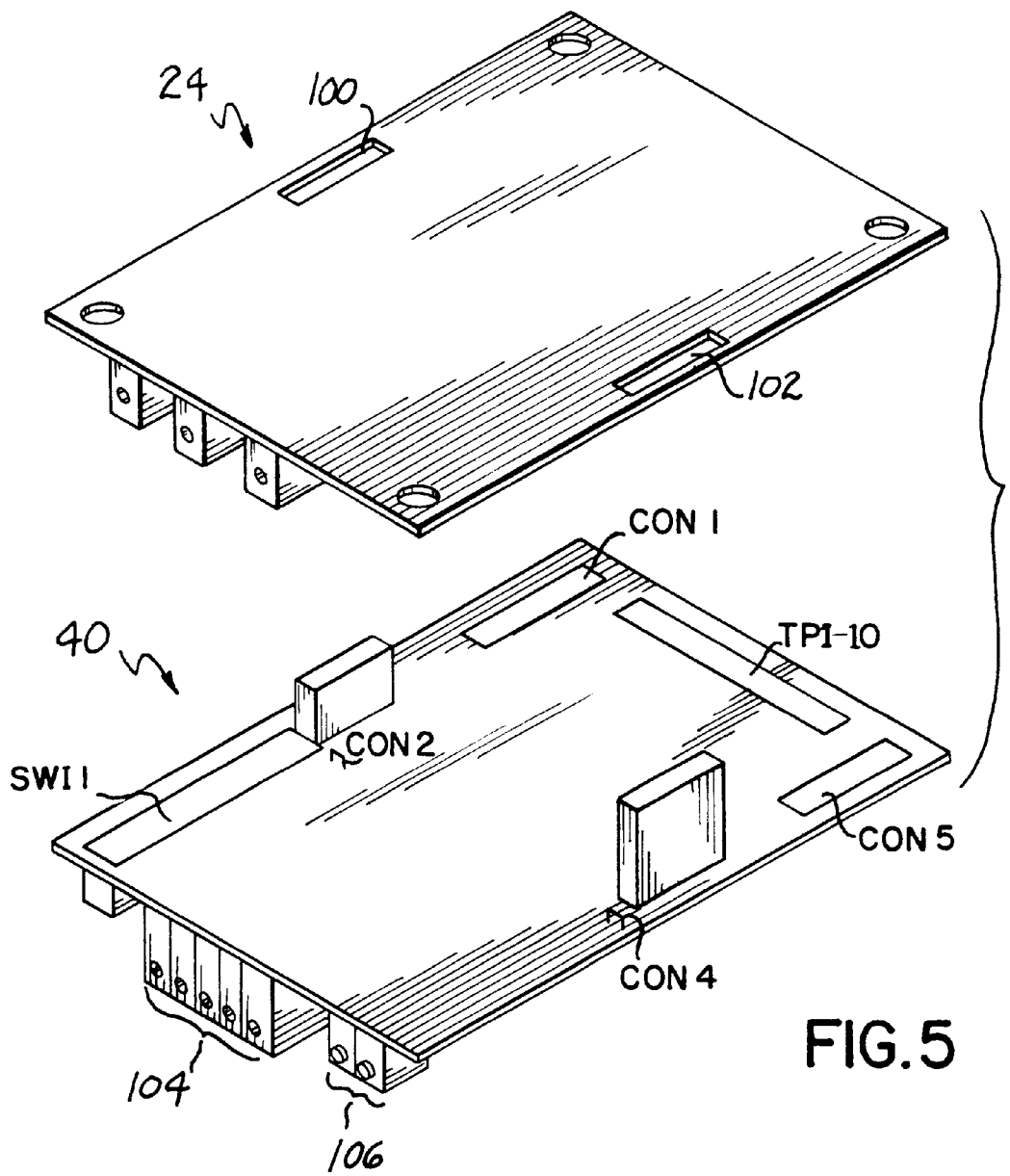
FIG. 5 is a perspective view of one embodiment of the present invention coupled with a temperature control board of a commercially available CVD system.

Generally, the COT board 40 will be interfaced with the RTD board 24 by "piggybacking" the COT board onto the RTD board (see FIG. 5). In that way, the signals required by the inventive COT board 40 are preferably obtained directly from the CVD system through circuitry already existing the RTD board 24, and specifically through original interface connectors that plug into the RTD board 24 of the Genus system.

RTD Board Calibration/verification System

Figure 3:
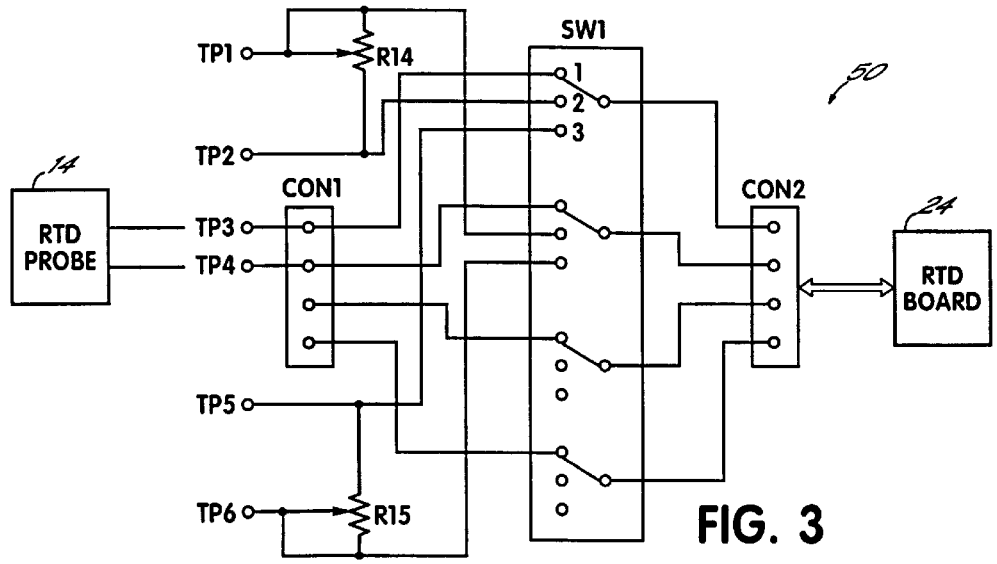
FIG. 3 is a circuit schematic of another operational subsystem of the present invention.

FIG. 3 illustrates the RTD calibration/verification system 50, which is one subsystem of COT board 40, and is utilized to calibrate and verify the operation of certain aspects of the RTD board 24, as well as to verify the proper operation of the RTD probe 14. More specifically, the RTD calibration/verification system 50 enables calibration of the RTD board calibration resistors, calibration of a zero/ambient temperature point for the operation of the RTD board, calibration of an operational temperature point for the RTD board, verification of the zero temperature point, verification of the operational temperature point, and verification of the probe resistance of the RTD probe 14.

Turning to FIG. 3, system 50 includes a plurality of test junctions indicated as a series of test points, TP1–TP6, shown on the left side of the figure. The junctions or test points provide access points for calibrating and verifying the operation of the RTD board 24 and RTD probe 14 in accordance with the principles of the invention.

RTD Probe Verification

The proper operation of the RTD probe 14 may be easily and readily verified with the present invention, and particularly using system 50 without removing the probe from the CVD chuck or disconnecting the probe from the CVD system. Furthermore, no additional circuitry must be modified. The RTD probe 14 is coupled to test points TP3 and TP4 of a connector CON1 and is coupled to the RTD board 24 through a four-pole, three-position or three-throw interface switch SW1, and through an interface connector CON2. By moving SW1 to position "2" or "3," as illustrated in FIG. 3, the electrical connection between the RTD probe 14 and RTD board 24 is broken. In that way, the resistance of the probe 14 may be measured without being affected by RTD board 24. SW1 allows the probe 14 to be selectively connected and disconnected from the system very easily for calibration and system operation purposes.

For verifying the probe's operation, a resistance meter (not shown) is connected to TP3 and TP4 of connector CON1 when SW1 is in position "2" or "3," and will provide an accurate resistance measurement of the probe depending upon the temperature thereof. First, the probe 14 is measured to determine that it is providing an appropriate resistive output signal. A short circuit or very low or very high resistance value may indicate that the RTD probe is malfunctioning. Generally, the value of the resistive output signal of the probe will be within a known range for the commercially available probe (e.g., between 100 Ohms and 233.5 Ohms for the Genus system). When SW1 is in position "1," the temperature of the heated chuck and probe 14, as provided by an appropriate temperature display of the CVD system, may also be monitored to see if the probe is accurate during operation of the CVD system. Depending upon the probe operation, as determined by its design and the specific CVD system, the chuck may be heated to predetermined temperature points and the probe measured at those points to determine that it is providing the proper resistive output for a given temperature.

Again, the probe is easily connected to and disconnected from the RTD probe control board 24 for determining the probe's functionality and accuracy. No disassembly of the system is necessary using the inventive system 50 and the probe remains embedded in the heated chuck.

In accordance with another aspect of system 50 of the invention, the measured resistance values provided by the probe when disconnected from board 24 may be used to more accurately calibrate the board. For example, the RTD probe 14 outputs an effective resistance based upon its temperature and the temperature of the heated chuck. The probe output resistance is directly proportional to the probe temperature, and commercially available probes will have an associated table of predetermined resistance values based upon a zero or ambient temperature and selected operational temperatures. For example, the probe used in the GENUS 8700 System outputs a resistance of approximately 100 ohms when the temperature of the probe is approximately 0° C. With respect to the operational temperature of the Genus probe, an output of approximately 233.5 ohms is yielded by a probe operational temperature of approximately 360° C. The actual measured probe resistances at 0° C. (zero/ ambient point) and 360° C. (operational point), however, may vary slightly from 100 ohms and 233.5 ohms, respectively. As discussed further hereinbelow, the calibration of the RTD board may be done by setting the input resistances of calibration potentiometers or variable resistors at the actual measured probe resistances of the zero/ambient point and the operational point, rather than at the table resistance values for those points (e.g., 100 ohms and 233.5 ohms). Therefore, by allowing accurate measurement of the individual probe resistances, the RTD board 24 may be more accurately calibrated based upon the measured probe resistance values at selected temperature points, rather than based upon commercially set table values, such as 100 ohms and 233.5 ohms.

Zero Temperature Point Calibration/verification

The zero temperature (or ambient temperature) point for operation of the RTD board 24 is reflective of the operation of the board when the RTD probe 14 is reading an effective chuck temperature of 0° C. (or ambient temperature). The RTD board 24 which interfaces with the probe includes an amplifier stage (not shown) which has a variable gain value and a variable offset value, both of which must be adjusted and set according to the operation of the particular CVD system to calibrate board 24 and to calibrate the probe operation. The operational manual for conventionally available CVD systems will indicate how to adjust and set the gain value and offset value of the RTD board amplifier stages when calibrating the RTD board.

The zero/ambient temperature point can be calibrated in the inventive system 50 by moving SW1 to position "2." As shown in FIG. 3, in position "2" of SW1, a first resistance network including a potentiometer or variable resistor R14 will be coupled to the RTD board 24 through CON2. If the RTD board 24 gain and offset values are to be calibrated for a zero/ambient temperature without reference to the measured resistance of RTD probe 14 at 0° C. as discussed above, the potentiometer or variable resistor R14 is preset to a predetermined or table zero/ambient temperature resistance value, such as the 100 ohm/0° C. resistance value for the GENUS System. Other predetermined zero/ambient temperature resistance values might also be utilized for different systems and RTD probes. At a 100 ohm setting for variable resistor R14, the RTD board 24 is calibrated to provide a visual reading of approximately 0° C. as shown by the visual temperature display (not shown) of the CVD system. As discussed, the zero/ambient temperature point might also be referenced to the ambient temperature rather than 0° C., if the predetermined ambient temperature resistance value reading is available for the probe and CVD system.

Once the selected zero/ambient temperature point resistance value is set by adjusting R14, the RTD board gain values and offset values for the amplifier stages therein are adjusted according to well known techniques for the commercially available RTD boards and CVD system. The amplifier gain and offset values are set so that the visual display will show a 0° C. or ambient temperature reading corresponding to the set value of R14. That is, when 100 ohms is set for R14 using a Genus system, the visual display should show approximately 0° C. or the amplifier offset/gain values are adjusted until it does. At the zero/ambient temperature point, the resistive temperature probe 14 is considered to be in a non-operational state, because the CVD system will generally not be operating at such low chuck and probe temperatures. Therefore, the first resistance network comprising R14 simulates the resistance of the resistive temperature probe 14 in the non-operational state. R14 may be selectively connected to the RTD board 24 to simulate the probe as necessary for calibrating the RTD board without actually heating or cooling the probe.

Alternatively, to calibrate the zero/ambient temperature point for the RTD board 24 with the actual measured probe resistance, the individual probe resistance at 0° C. (or ambient temperature) may be found and R14 may be adjusted to that value. As discussed above for measuring the resistive probe verification, a resistance meter may be connected to the probe through TP3 and TP4 at 0° C. or ambient temperature to find the appropriate probe reading, when SW1 is in position "2" or "3." Since the actual measured probe resistance value at a selected temperature may vary from the predetermined or table resistance value supplied by the probe manufacturer or CVD system manufacturer, the measured resistance may be found using the present invention by monitoring TP3 and TP4 with the resistance meter while the probe is heated or cooled to the selected temperature, or allowed to settle at ambient temperature. After the resistance value is measured, R14 is adjusted to the actual measured probe resistance at the selected temperature. Again, the board 24, and particularly the amplifier stages of the board, are calibrated at the specific R14 resistance to yield a visual display of the selected temperature corresponding to the measured probe resistance.

The first resistance network comprising R14 is coupled to a test junction including test points TP1 and TP2. For varying and adjusting the simulated probe resistance using R14, an appropriate resistance meter (not shown) is coupled to junction test points TP1 and TP2 when the switch SW1 is in position "1" or "3." In position "1" or "3," SW1 disconnects the first resistance network from the RTD board. Reading the resistance meter, R14 is appropriately adjusted to raise or lower the resistance as necessary. Test points TP1 and TP2 may also be subsequently utilized for verifying that R14 is at the selected resistance value.

Operational Temperature Point Calibration/verification

The zero/ambient temperature point for operation of the RTD board is reflective of the non-operational state of the CVD system and probe, such as when the RTD probe 14 is reading an effective ambient temperature. However, the RTD board must also be calibrated at an operational temperature point, i.e., the temperature point to which the heated chuck is heated when the CVD system and RTD probe are in an operational state. The selected processing temperature will depend on the particular CVD process. For example, deposition of tungsten silicide will require a temperature of around 360° C., while other processes may require temperatures up to 600° C. or higher. The operational temperature point can be calibrated for board 24 by moving SW1 to position "3." In that way, a second resistance network potentiometer or variable resistor R15 is coupled to the RTD board 24 through CON2. Calibration of RTD board 24 at the operational temperature is similar to calibration at the zero/ambient temperature. If the operational temperature point for the RTD board 24 is to be calibrated without reference to the actual measured resistance of the RTD probe 14 at a selected temperature, then the resistance value of R15 is preset to a predetermined or table operational temperature resistance, such as a 233.5 ohm value for 360° C., referring again to the GENUS System. Other predetermined operational temperature resistance values might also be utilized for different systems and for different CVD processing temperatures. At a 233.5 ohm setting for R15, the RTD board is then calibrated to provide a CVD system reading of approximately 360° C. or some other operational temperature.

The second resistance network comprising R15 is coupled to a test junction including test points TP5 and TP6. For varying and adjusting the simulated probe resistance using R15, an appropriate resistance meter is coupled to junction test points TP5 and TP6 when the switch SW1 is in position "1" or "2." In position "1" or "2," SW1 disconnects the first resistance network from the RTD board. Reading the resistance meter, R15 is adjusted to raise or lower the resistance to the desired value. Test points TP5 and TP6 may also be subsequently utilized for verifying that R15 is at the selected resistance value.

Alternatively, to calibrate the operational temperature point for the RTD board 24 with the measured probe resistance, the individual probe resistance at 360° C. (or some other operational temperature) may be found and R15 may be adjusted to that value. As discussed above, for the RTD probe measurement at a selected temperature, a resistance meter may be connected to the probe through TP3 and TP4, when the probe is heated to 360° C. or another operational temperature. The probe reading is made when SW1 is in position "2" or "3" so that the probe is disconnected from the RTD board. The measured probe resistance at the operational temperature may vary from the table value of 233.5 ohms or some other predetermined operational temperature resistance value for the particular CVD system and probe. The measured resistance value may be utilized by monitoring TP3 and TP4 with the resistance meter, and then setting the potentiometer R15 to the measured probe resistance at 360° C. (or another temperature). With R15 at the setting of 233.5 ohms or the measured operational point probe resistance at the 360° C. point, RTD board 24 is then calibrated.

Switch SW1 isolates the RTD board 24 and RTD probe 14 for verification of their operation as well as for zero/ambient temperature and operational temperature calibration and verification. The isolation provided by switch SW1 allows the various verification and calibration steps to be completed easily without requiring additional interfacing or the removal of components associated with either the RTD board or the RTD probe. The various test junctions and test points provide ready access to the RTD probe 14 and RTD board 24. Furthermore, the operation of probe 14 may be verified while the system continues operating. By moving SW1 to position "3," R15 is coupled to the system and the probe is disconnected, and R15 simulates the probe so that the system is running without the probe. The probe may then be checked for proper operation and then switched back into connection with the system by moving SW1 back to position "1."

Chuck Temperature Monitoring Circuit

Figure 2:
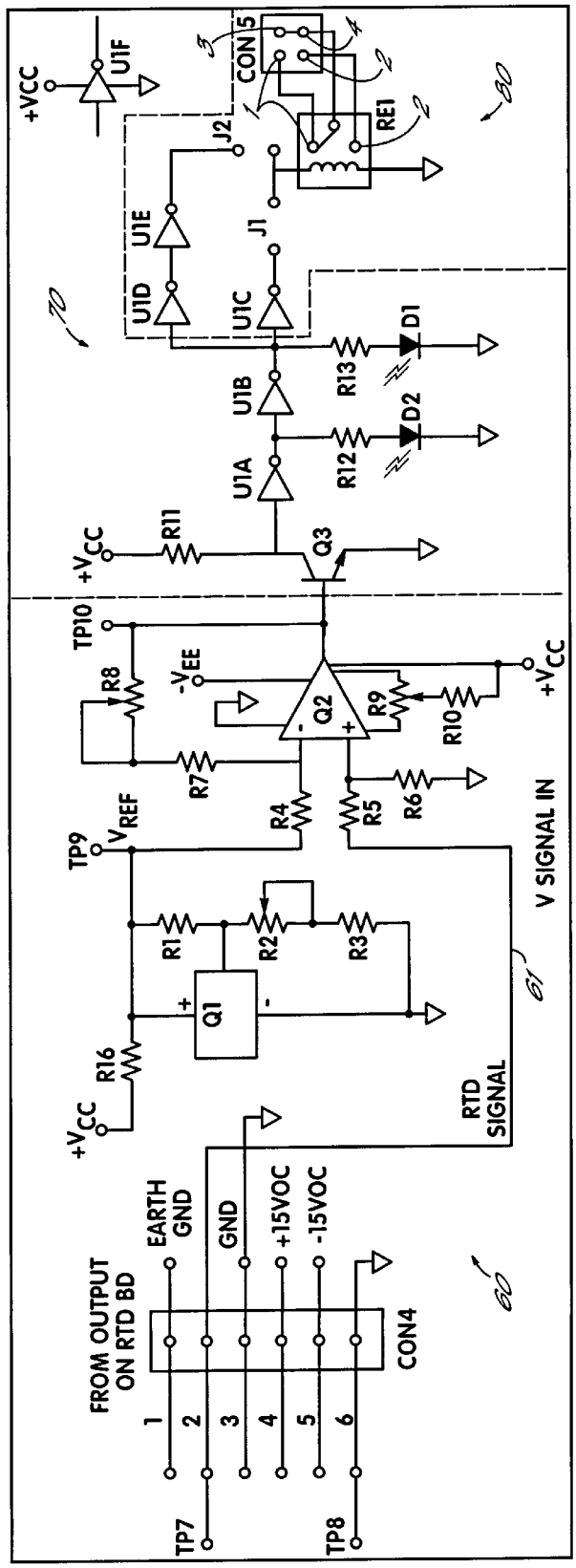
FIG. 2 is a circuit schematic of several operational subsystems of the present invention.

In accordance with another aspect of the present invention, the temperature of the heated chuck, as indicated by the RTD probe and RTD board, is monitored during its operational state to determine if the heated chuck is over-temperature, that is, exceeding the desired operational temperature. If such an over-temperature condition exists, the heated chuck could overheat and melt, causing a wide variety of problems as discussed above. The probe may also be monitored for an under-temperature condition, as discussed below. The circuit or subsystem 60, as illustrated on the left side of FIG. 2, is designed to monitor a probe temperature signal from the RTD board 24, to create an adjustable operational temperature limit value reflective of an over-temperature condition, to compare the temperature signal from the RTD board to the limit value, and to convert the result of that comparison to a usable CMOS logic signal. The circuitry includes a six-pin connector CON4, test junctions defined by four test points, TP7, TP8, TP9, and TP10, eight resistors, R1, R3–R7, R10, and R16, three variable resistors or potentiometers R2, R8, R9, one voltage comparator Q2, and one adjustable voltage source Q1.

RTD Board Output Verification

Circuit 60 couples directly to the RTD board 24 through the six-pin connector CON4, and specifically through pins 2 and 3 of that connector. Test point TP7 is tied directly to the appropriate output temperature signal from the RTD board, while test point TP8 is tied to ground on Pin 6 of CON4. The test junction comprising TP7 and TP8 allows the RTD board 24 to be checked to verify that it is operating by connecting a volt meter across those test points and looking for the existence of an adequate voltage reading from the RTD board, depending upon the temperature of the chuck and RTD probe. An operator generally familiar with the CVD system will know approximately the level of the signal which should be available at TP7 for a particular CVD processing temperature. The RTD board output as available on TP7 and TP8 may also be utilized for calibrating the gain and zero offset of amplifier stages on the RTD board, as discussed above. Rather than reading a visual temperature display of the CVD system, which indicates a temperature based upon the reading from the RTD probe and RTD board, the output of the RTD board could be read directly with a voltmeter for calibration thereof based upon the degree-to-volt conversion of the RTD board output for that particular CVD system, as discussed further hereinbelow. For example, in the GENUS system, the RTD board temperature signal increases approximately 10 millivolts for every 1° C. increase in chuck temperature as measured by the varying resistance of the RTD probe.

Therefore, the COT board 40 may be utilized for directly calibrating and verifying the output side of the RTD board. The RTD board of the GENUS 8700 System also includes a wheatstone bridge which must be calibrated separately from the COT board 40 according to instructions associated with the GENUS System and well known calibration techniques. The wheatstone bridge calibration is well understood and therefore need not be described herein. Test points TP7 and TP8 form an input circuit coupleable to the RTD board 24 for providing a chuck temperature signal which is reflective of a measured temperature of the heated chuck.

Adjustable Operational Temperature Limit Circuit

The chuck temperature voltage signal from the RTD board on line 61 from CON4 and TP7 is compared to an adjustable reference voltage which is reflective of an upper limit operational temperature point for the heated chuck. To that end, a voltage reference diode, Q1, such as an LM385 available from National Semiconductor is utilized. Voltage reference diode Q1 acts as a variable voltage source. The operational temperature limit voltage signal provided by diode Q1 is dependent upon the resistance values of variable resistor or potentiometer R2 and fixed resistor R3. The formula for determining the level of the voltage signal of diode Q1 is:

$$V_{OUT} = 1.24((R2+R3/R2)+1)$$

The various suggested values for the electrical components of the disclosed embodiment of the invention, such as the resistors utilized in the Figures of the present invention, are suggested for use with the GENUS 8700 System. It will be understood by a person of ordinary skill in the art that the values may be adjusted or changed depending upon the type of CVD system utilized with the present invention and the desired signal levels which are required for a particular CVD system. The suggested values for the illustrated circuits 50, 60, and 70 are listed in the table below.

TABLE 1

| Reference Number | Ohms |
| --- | --- |
| R1 | 200K/1% |
| R2 | 500K, 25 Turns |
| R3 | 200K/1% |
| R4 | 1K/1% |
| R5 | 1K/1% |
| R6 | 3K/1% |
| R7 | 1K/1% |
| R8 | 500K, 20 Turns |
| R9 | 5K, 20 Turns |
| R10 | 1K/1% |
| R11 | 3K/1% |
| R12 | 269 Ω |
| R13 | 269 Ω |
| R14 | 500 Ω/25 Turns |
| R15 | 500 Ω/25 Turns |
| R16 | 300/1% |

The reference voltage signal of diode Q1 will be scaled according to the degree-to-volt output scale of the signal on line 61 from the RTD board, and will be set accordingly. For example, the GENUS 8700 RTD board 24 maintains an output reflective of the measured chuck temperature that represents approximately 10 mV per degree 1° C. of chuck temperature. Therefore, the reference voltage from Q1 is scaled according to such a ratio. As illustrated in FIG. 2, with the suggested component values, Q1 is configured to maintain an adjustable voltage in the range of approximately 2.48 Volts DC to 5.58 Volts DC. Assuming the use of a GENUS 8700 System, the reference voltage signal range translates into a reference temperature range for the heated chuck of approximately 248° C. to 558° C. Other ranges may also be used. In accordance with the principles of the present invention, the reference voltage signal $V_{REF}$ from diode Q1 is compared to the voltage signal from the RTD board on line 61 to determine whether the temperature of the heated chuck is exceeding or below the desired operational processing temperature limit.

In a preferred embodiment of the invention, a chuck over-temperature condition is monitored to determine when the chuck temperature exceeds an upper operational temperature limit. However, in accordance with another feature of the invention, the operational temperature limit of the operational temperature circuit including Q1 may be set for a lower operational temperature limit so that an under-temperature condition is monitored. Such under-temperature condition monitoring may be used, for example, to ensure that the proper amount of heat is delivered to a CVD process through the chuck.

Assuming a CVD processing temperature for the GENUS System of approximately 360° C., (deposition of tungsten silicide) the adjustable reference voltage, which reflects an operational temperature limit, may be maintained to indicate an over-temperature condition of the heated chuck above approximately 360° C. That is, the operational temperature limit voltage from Q1 is set above the 360° C. point (according to the volt/degree scale) to a suitable upper limit point. Normally, as the chuck is heated up to the desired processing temperature, there will be a certain amount of temperature overshoot (e.g. ±20° C. overshoot) where the chuck temperature actually exceeds the desired 360° C. temperature. The overshoot is due to the CVD system controls. Therefore, in a preferred embodiment of the invention, the limit voltage will be set for an upper temperature limit of around 380° C. to account for the overshoot.

The output voltage of Q1 may be measured at the test junction indicated by test point TP9. Therefore, connecting a volt meter at TP9 and TP8 will allow for a measurement of the operational temperature limit voltage. Resistor R2 is adjusted until the desired over-temperature limit point or trip point is achieved. Using the volt/degree scale of the Genus system, for example, a 380° C. trip point would require a voltage reading of approximately 3.8 Volts DC at TP9.

Temperature Comparison

The comparator portion of circuit 60 is based upon voltage comparator Q2, which is preferably an LM311 FET input voltage comparator, available from National Semiconductor. As illustrated in FIG. 2, voltage comparator Q2 is an operational amplifier configured in a closed loop differential amplifier configuration. The output of Q2 is based upon the operational temperature limit voltage $V_{REF}$ from Q1, as well as the $V_{SIGNAL\ IN}$ voltage of the RTD temperature signal on line 61.

The comparator output voltage $V_{OUT}$, as measured at test point TP10, is set by the following formula:

$$V_{OUT} = VOUT_{REF} + VOUT_{SIGNAL\ IN}$$

Whereas $$VOUT_{REF} = -((R7+R8)(V_{REF})/R4) \text{ and}$$

$$VOUT_{SIGNAL\ IN} = (R6/R5+R6)((R4+R7+R8)/R4)\ V_{SIGNAL\ IN}$$

The two voltages to be compared, $V_{REF}$ and $V_{SIGNAL\ IN}$ have values based on the desired volt/degree scale for the particular CVD system and probe. Again, in the GENUS 8700 System, the signals $V_{REF}$ and $V_{SIGNAL\ IN}$ are scaled to the 10 mV per 1° C. scale. The values $VOUT_{REF}$ and $VOUT_{SIGNAL\ IN}$ are reflective of the voltages applied at the negative and positive terminals, respectively, of the comparator Q2. In turn, $VOUT_{REF}$ and $VOUT_{SIGNAL\ IN}$ are reflective of $V_{REF}$ and $V_{SIGNAL\ IN}$, respectively.

The comparator portion of circuit 60, based upon the operation of voltage comparator Q2, has both an offset balancing characteristic, as well as a gain characteristic. The offset balancing characteristic is utilized to remove any DC voltage level shift from the output $V_{OUT}$ of Q2. In other words, when $V_{REF}$ and $V_{SIGNAL\ IN}$ are generally the same value, the output of Q2 will be 0 VDC. When $V_{SIGNAL\ IN}$ is greater than $V_{REF}$, indicating an over-temperature condition, the output voltage $V_{OUT}$ is positive to drive an indicator, as discussed below. A $V_{REF}$ greater than $V_{SIGNAL\ IN}$ may indicate an under temperature condition as $V_{OUT}$ goes from a positive to a negative value.

For setting the offset balance to reduce any DC level shift in the output, the COT board 40 is disconnected from RTD board 24 and test point TP9 is jumped to test point TP7, which will provide the condition $V_{REF} = V_{SIGNAL\ IN}$. R9 is then adjusted until there is an approximately 0 VDC output at TP11.

The gain portion of circuit 60 is utilized to adjust the range or "window" at which circuit 60 will provide an indication of the heated chuck being in an over-temperature condition, as discussed further hereinbelow in greater detail. The gain of comparator Q2 will be the same as the gain of a conventional inverting amplifier when R8 is adjusted to equal approximately 2 Kohms. The equation for an inverting amplifier is as follows:

$$G = -R7 + R8/R4$$

Depending upon the desired gain for comparator Q2 and the desired output values needed for driving an output stage, such as the indicator circuit of the invention, R8 is adjusted accordingly. In that way, the chuck temperature voltage from the RTD board $V_{SIGNAL\ IN}$ is compared against the operation temperature limit voltage $V_{REF}$ to determine whether the heated chuck is in an over-temperature or under-temperature condition.

Visual Display Circuit

The circuit or subsystem indicated in FIG. 2 by dashed lines and reference numeral 70 is a visual display portion which provides a visible indication of the operational status of the heated chuck. An audible indication might be used in an alternative embodiment of the invention. The indicator portion 70 indicates whether a chuck over-temperature or under-temperature condition does or does not exist. Circuit 70 includes a transistor Q3 such as a 2N2102 NPN transistor available from National Semiconductor, two inverting buffer chips U1, such as CD4049 buffers available from National Semiconductor, resistors R11, R12, and R3, a green LED D1, and a red LED D2. The buffer chips U1 provide the individual buffer elements illustrated in FIG. 2 as U1A, U1B, U1C, U1D, U1E, and U1F. Based upon a GENUS System, the value of R11 is preferably approximately 3 Kohms, while the value of R12 and R13 is approximately 269 ohms, although other values might be utilized for different CVD systems. The LEDs D1 and D2 are conventional LEDs. When the invention is configured for monitoring an over-temperature condition, the green LED D1 is utilized to indicate that the heated chuck is within the proper operating temperature range and is not experiencing an over-temperature condition. The red LED D2 reflects an over-temperature condition.

More specifically, when $V_{SIGNAL\ IN}$ from the RTD board has a value which is below the value of $V_{REF}$, then the green LED D1 is illuminated in accordance with the principles of the present invention to indicate that the heated chuck is operating properly. If the value of $V_{SIGNAL\ IN}$ exceeds the value of $V_{REF}$, which indicates that the temperature of the heated chuck as measured by the RTD probe is above the operational temperature limit, then the red LED D2 is illuminated to indicate an over-temperature condition. The circuit portion 70 illustrated in FIG. 2 is configured for indicating an over-temperature condition for the heated chuck. As discussed above, circuit portion 70 might be utilized to indicate an under-temperature condition for the heated chuck, by varying the $_{REF}$ value and by varying the position of the LEDs, as discussed below. The output signal $V_{OUT}$ generated by Q2 is coupled to transistor Q3 to drive the base of the transistor.

The red LED D2 is driven through inverter U1A connected in series with R12. When the value of $V_{SIGNAL\ IN}$ is below $V_{REF}$ the output of Q2 is negative and thus is a LOW logic level signal. The output of Q2 drives transistor Q3; therefore, when Q2 is LOW, Q3 is OFF, which drives the input to inverter U1A to a HIGH level as indicated by $V_{cc}$. The inverter U1A then outputs a LOW level to the second stage inverter U1B which produces a HIGH level at LED D1 to drive and illuminate the green LED through R13.

For an over-temperature condition, the output $V_{OUT}$ of Q2 is a HIGH logic level and drives Q3 to an ON, or conductive, state. Preferably the output of Q2 drives the base of Q3 above a saturation point. The input to inverter U1A is then pulled LOW, which produces an output of U1A which is HIGH, thus driving the red LED D2 to indicate the over-temperature condition. U1B inverts the HIGH drive signal so that the green LED D1 turns off. Therefore, the green LED D1 and the red LED D2 are turned on and off in a mutually exclusive manner, dependent upon whether the heated chuck is operating in a proper temperature range, or whether it is outside its proper range. Accordingly, the present invention provides a visible indication of the operation of the heated chuck. When an over-temperature condition is indicated, the power to the heated chuck can be turned off to prevent overheating of the chuck and a meltdown. While visual indicators are shown, audible indicators, such as buzzers, may also be utilized. Furthermore, when monitoring for an under-temperature condition, the red and green LEDs may be interchanged in the circuit of FIG. 2 so that when $V_{SIGNAL\ IN} > V_{REF}$ as desired for monitoring an under-temperature condition, the green LED will be lit.

Output Interface Circuit

While the LED devices D1 and D2 provide a visual indication of the operating status of the heated chuck to prevent an over-temperature condition and meltdown, the present invention utilizes an additional output interface circuit indicated by reference numeral 80 which may be used to provide further indication of the operational status of the heated chuck to other interfaced systems and to thereby control, indirectly, the operation of the heated chuck. The preferred embodiment of circuit 80 as illustrated in FIG. 2 utilizes three inverting buffers U1C, U1D, and U1E, one miniature relay RE1, and a four-pin connector CON5. Circuit 80 provides an output interface circuit for use with a multitude of different interfaces.

The output of inverter U1B drives jumper point J1 through inverter U1C. The output of inverter U1B also drives jumper point J2 through two inverters, U1D and U1E. Therefore, jumper point J1 will be the logical opposite of the signal driving the green LED D1, whereas jumper point J2 will have the same logic value as the signal driving the green LED D1. As such, J2 will be HIGH when the heated chuck is operating properly (over-temperature monitoring) and the green LED is illuminated (J1 is LOW). Alternatively, jumper point J1 is HIGH when the output of U1A is HIGH to illuminate the red LED D2 (jumper point J2 is LOW/green LED off). Therefore, either jumper point J1 or J2 may be utilized to drive relay RE1, depending upon the desired output interface. Jumper point J1 can be used to drive the relay RE1 when the heated chuck is in an over-temperature condition and the red LED D2 is illuminated. Alternatively, jumper J2 can drive RE1 when the heated chuck is operating properly and the green LED D1 is illuminated.

Circuit 80, as illustrated in FIG. 2, utilizes a connector CON5 which has Pins 3 and 4 ganged together. The relay RE1 is a single pole, dual throw, miniaturized relay such as a DS1E-S available from Aromat in Garden Grove, Calif. The base connection for the relay RE1 is connected to the Pins 3 and 4 of connector CON5. In the unactivated position, the switch contacts the first pole as illustrated in FIG. 2. When the coil element of relay RE1 is activated by one of the jumper points J1 or J2, the switch is thrown to pole two. In that way, either Pin 1 or Pin 2 of CON5 is connected to the ganged Pins 3 and 4 of connector CON5. Utilizing the present invention with the GENUS System, Pins 3 and 4 of CON5 are preferably coupled to ground, because the GENUS System is based upon a negative logic scheme. Depending upon the desired output from circuit 80 at a particular chuck condition (i.e., over-temperature/under temperature operation or proper operation), jumper points J1 or J2 may be coupled to the relay RE1. Furthermore, the interfacing to Pins 1 and 2 of CON5 also provide flexibility and variability with respect to the output circuit 80.

In one preferred embodiment of the invention, the output circuit 80 of the COT board 40 for each chuck is coupled to the appropriate over-temperature input for the CVD system processor (not shown) through digital interface circuitry 44, termination circuitry 45, and control board 42 (See FIG. 1). With the GENUS 8700 System which has six chuck assemblies, each of the six individual COT boards 40 is connected electrically in series to the over-temperature digital input of the CVD system processor by coupling the processor input bit to the outputs from Pin 2 of the various CON5 connectors in series. In that way, an over-temperature failure of any heated chuck will provide illumination of red LED D2 and will provide a HIGH output at jumper point J1. If the relay RE1 is coupled to jumper point J1, the switch of relay RE1 will toggle to pole 2 and couple Pin 2 of CON5 to Pins 3 and 4. If Pins 3 and 4 are grounded, and the over-temperature processor bit of the CVD system processors is coupled to Pin 2 of CON5 of each COT board of CON5, the processor input bit will be grounded to a LOW logic signal indicating that at least one of the chucks is in an over-temperature condition. The processor will then respond by turning off the power to the chuck heater element. Of course, other CVD systems which utilize different logic schemes might also be interfaced appropriately with circuit 80 and the COT board 40 by changing jumper points and the various PIN connections of connector CON5. For example, jumper point J2 might be used to activate relay RE1 when the chucks are operating properly and to deactivate RE1 in the over-temperature condition. In that way, a number of different interfacing states or options are available in the interfacing circuit of the invention.

Voltage Conversion Circuit

Figure 4:
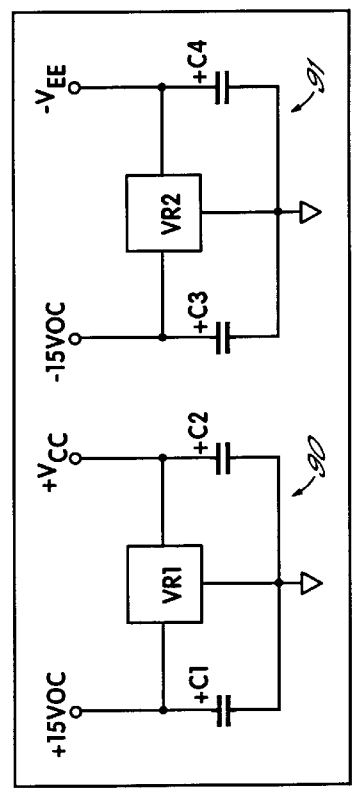
FIG. 4 is a circuit schematic of another operational subsystem of the present invention.

The power supplied from a CVD system may be higher than that required for the COT board 40 of the present invention. To that end, a voltage conversion circuit as illustrated in FIG. 4 may be utilized. One preferred embodiment of the invention is configured with the GENUS System which includes +/−15 VDC power which must be converted to +/−12 VDC for operation of the COT board 40, which is applied as $+v_{CC}$ and $-v_{EE}$. Referring to FIGS. 2 and 4, the +15 VDC comes in on PIN4 of CON4, whereas the −15 VDC comes in on PIN5 of CON4 when the COT board is piggy-backed to RTD board 24. Each of the voltage conversion circuits 90 and 91 as illustrated in FIG. 4, utilize voltage converters. For example, circuit 90 utilizes the voltage converter VR1 which may be, for example, an LM78L12 available from National Semiconductor. Similarly circuit 91 utilizes a voltage converter VR2 which may be, for example, an LM79L12, also available from National Semiconductor. Capacitors C1 and C3 are preferably 2.2 $\mu$F whereas capacitors C2 and C4 are preferably 1.0 $\mu$F. It will be understood by a person of ordinary skill in the art that different component values and different voltage converters might be utilized for other CVD systems. The voltage conversion circuits 90, 91 also provide +/−12 VDC and insure that the supply voltages are consistent and steady, by reducing voltage fluctuations.

Referring to FIG. 5, the COT board 40 is shown in position to be "piggybacked" with RTD board 24 of a GENUS system. On the COT board, connectors CON2 and CON4 electrically couple with existing RTD board connectors 100 and 102, respectively. In that way, as illustrated in FIGS. 2 and 3, the necessary inputs and outputs of the RTD board are available to the inventive COT board without additional connections. As shown in FIG. 5, the COT board also includes the bank of variable resistors 104 and LEDs 106 utilized in the circuit, as well as the necessary test junctions indicated by test points TP1–10.

By coupling the RTD board 24 and COT board 40 as shown in FIG. 5, the invention eliminates the need for disassembling a portion of the CVD system for calibration and monitoring purposes.

Through the various test points, TP1 through TP10, the critical voltage values and signals are readily accessible. In that way, the RTD board and probe may be readily calibrated and verified. Furthermore, the entire system may be monitored for over-temperature or under-temperature conditions, and the output interface discussed above may be configured for further controlling the heated chuck upon the detection of such a condition.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A system coupleable to a heated wafer chuck control system for providing an indication that the heated wafer chuck is operating at a temperature outside of a desired operational temperature range for the chuck, the system comprising:

an operational temperature circuit for generating an operational temperature limit signal, the operational temperature limit signal being reflective of a selected operational temperature limit for a heated wafer chuck;

an input circuit configured for coupling to a heated wafer chuck control system, the input circuit providing a chuck temperature signal which is reflective of the actual measured temperature of the heated chuck;

a comparator circuit coupled to said operational temperature circuit and said input circuit, the comparator circuit operable for comparing the operational temperature limit signal to the chuck temperature signal and providing an output signal reflective of the difference between the chuck measured temperature and the operational temperature limit;

an indicator coupled to said comparator circuit, the indicator generating a humanly-perceptible indication of the chuck temperature status with respect to the operational temperature limit in response to said output signal.

2. The system of claim 1 wherein the operational temperature limit signal and chuck temperature signal are voltage signals.

3. The system of claim 1 wherein said voltage signals are scaled to a temperature scale.

4. The system of claim 1 wherein said operational temperature circuit is adjustable for varying the operational temperature limit signal to be reflective of the selected operational temperature limit for the heated chuck.

5. The system of claim 4 wherein said operational temperature circuit comprises a variable resistor for adjusting the circuit and varying the operational temperature limit signal.

6. The system of claim 1 wherein said comparator circuit comprises an operational amplifier operable for comparing said operational temperature limit signal and said chuck temperature signal.

7. The system of claim 1 wherein said indicator comprises a light device for visually indicating the chuck temperature status.

8. The system of claim 7 wherein said light device includes a plurality of lights, the indicator operable for illuminating at least one of said lights, in response to said output signal, to indicate that the heated chuck is operating above said operational temperature limit.

9. The system of claim 7 wherein said light device includes a plurality of lights, the indicator operable for illuminating at least one of said lights, in response to said output signal, to indicate that the heated chuck is operating below said operational temperature limit.

10. The system of claim 1 further comprising an interface circuit coupled with said comparator and responsive to said output signal, the interface circuit having a plurality of interfacing states and being in a first state when the heated chuck is operating above the operational temperature limit and in a second state when the heated chuck is operating below the operational temperature limit.

11. The system of claim 10 wherein said interface circuit comprises a multiple position switch which is responsive to said output signal.

12. The system of claim 1 further comprising a test junction coupled to the operational temperature circuit for analyzing the operational temperature limit signal.

13. The system of claim 1 further comprising a test junction coupled to the input circuit for analyzing the chuck temperature signal.

14. The system of claim 1 further comprising a test junction coupled to said comparator circuit for analyzing the output signal.

15. The system of claim 1, wherein the chuck control system includes a measuring probe and probe control system, the input circuit being configured for coupling to the probe control system to obtain said chuck temperature signal.

16. A method for indicating that a heated wafer chuck is operating at a temperature outside of a desired operational temperature range for the chuck, the method comprising:

generating an operational temperature limit signal, the operational temperature limit signal being reflective of a selected operational temperature limit for a heated wafer chuck;

measuring the temperature of a heated chuck and generating a chuck temperature signal which is reflective of the actual measured temperature of the heated chuck;

comparing the operational temperature limit signal to the chuck temperature signal and providing an output signal reflective of the difference between the chuck measured temperature and the operational temperature limit;

generating a humanly-perceptible indication of the chuck temperature status with respect to the operational temperature limit in response to said output signal.

17. The method of claim 16 wherein the operational temperature limit signal and chuck temperature signal are voltage signals.

18. The method of claim 16 further comprising varying the operational temperature limit signal to select an operational temperature limit for the heated chuck.

19. The method of claim 16 further comprising illuminating a light in response to said output signal to indicate that the heated chuck is operating above said operational temperature limit.

20. The method of claim 16 further comprising illuminating a light in response to said output signal to indicate that the heated chuck is operating below said operational temperature limit.

21. The method of claim 16 further comprising providing a plurality of interfacing states in response to said output signal, and providing a first interface state when the heated chuck is operating above the operational temperature limit and a second interface state when the heated chuck is operating below the operational temperature limit.

22. A system to prevent a heated wafer chuck of a CVD system from operating at a temperature outside of a desired operational temperature range for the chuck, the system comprising:

an operational temperature circuit for generating an operational temperature limit signal, the operational temperature limit signal being reflective of a selected operational temperature limit for a heated wafer chuck;

an input circuit configured for coupling to a heated wafer chuck control system, the input circuit providing a chuck temperature signal which is reflective of the actual measured temperature of the heated chuck;

a comparator circuit coupled to said operational temperature circuit and said input circuits, the comparator circuit operable for comparing the operational temperature limit signal to the chuck temperature signal and providing an output signal reflective of the difference between the chuck measured temperature and the operational temperature limit;

an interface circuit coupleable to a CVD system and operable, in response to said output signal, for terminating the operation of the heated chuck.

23. The system of claim 22 wherein said interface circuit comprises a multiple position switch which is responsive to said output signal for providing an input to the CVD system to terminate the heated chuck operation.

24. The system of claim 22 wherein said operational temperature circuit is adjustable for varying the operational temperature limit signal to be reflective of the selected operational temperature limit for the heated chuck.

25. The system of claim 22 wherein said interface circuit is operable for terminating the operation of the heated chuck when said measured chuck temperature is below said operational temperature limit.

26. The system of claim 22 wherein said interface circuit is operable for terminating the operation of the heated chuck when said measured chuck temperature is above said operational temperature limit.

* * * * *